United States Patent

Sakata et al.

Patent Number: 5,716,757
Date of Patent: Feb. 10, 1998

[54] PHOTOSENSITIVE RESIN COMPOSITION USED FOR A CORRUGATED BOARD PRINTING PLATE

[75] Inventors: Norihiko Sakata, Yokohama; Shusaku Tabata; Yoko Ueno, both of Fuji, all of Japan

[73] Assignee: Asahi Kasei Kogyo Kabushiki Kaisha, Osaka, Japan

[21] Appl. No.: 325,405

[22] PCT Filed: Jun. 16, 1994

[86] PCT No.: PCT/JP94/00974

§ 371 Date: May 17, 1995

§ 102(e) Date: May 17, 1995

[87] PCT Pub. No.: WO95/00567

PCT Pub. Date: Jan. 5, 1995

[30] Foreign Application Priority Data

Jun. 18, 1993 [JP] Japan ..................... 5-170867

[51] Int. Cl.⁶ ........................................... G03F 7/027
[52] U.S. Cl. ........................... 430/284.1; 522/92; 522/96
[58] Field of Search .................... 430/284; 522/92, 522/96

[56] References Cited

U.S. PATENT DOCUMENTS

| | | | |
|---|---|---|---|
| 4,298,630 | 11/1981 | Kapuscinski et al. | 430/284.1 |
| 4,854,666 | 8/1989 | Kohara et al. | 350/96.34 |
| 4,932,750 | 6/1990 | Ansel et al. | 522/96 |
| 5,288,571 | 2/1994 | Nakamura et al. | 430/284.1 |

FOREIGN PATENT DOCUMENTS

| | | |
|---|---|---|
| 0263366 | 4/1988 | European Pat. Off. |
| 263366 | 4/1988 | European Pat. Off. |
| 427950 | 5/1991 | European Pat. Off. |
| 52-7363 | 3/1977 | Japan. |
| 53-35481 | 9/1978 | Japan. |
| 59-21541 | 5/1984 | Japan. |
| 6-1021118 A | 1/1986 | Japan ............ 522/96 |
| 4-95959 | 3/1992 | Japan. |
| 5-301935 | 11/1993 | Japan. |

*Primary Examiner*—Cynthia Hamilton
*Attorney, Agent, or Firm*—Birch, Stewart, Kolasch & Birch, LLP

[57] ABSTRACT

The present invention provides a liquid photosensitive resin composition used for forming a printing plate to print on a corrugated board comprising:

(A) 100 parts by weight of an unsaturated polyurethane prepolymer having a polyether polyol as a polyol segment, (B) 17 to 200 parts by weight of an ethylenically unsaturated compound and (C) 0.01 to 10 parts by weight of a photopolymerization initiator, characterized by comprising 17 to 65 parts by weight of an acrylate monomer represented by the following formula (I) per 100 parts by weight of the prepolymer of component (A) as the ethylenically unsaturated compound of component (B):

$$CH_2=CH-CO-O-(C_2H_4O)_n-R \quad (I)$$

wherein n represents a number of 1 to 20, R represents a linear or branched alkyl group having 2 to 22 carbon atoms.

A printing plate for use in printing a corrugated board obtained by curing the present composition has an increased impact resilience. When corrugated board printing is conducted by using the plate, printing is conducted well and paper dust or the like can be easily released from the surface of the plate.

8 Claims, No Drawings

PHOTOSENSITIVE RESIN COMPOSITION USED FOR A CORRUGATED BOARD PRINTING PLATE

TECHNICAL FIELD

The present invention relates to a liquid photosensitive resin composition used for forming a printing plate having an increased impact resilience for printing on a corrugated board. Such a printing plate has been strongly desired in the field of corrugated board printing.

BACKGROUND ART

As a printing plate material for corrugated board printing, there has been used a rubber, a solid photosensitive resin and a liquid photosensitive resin. The liquid photosensitive resin is often used as a printing material plate for corrugated board printing because of the economic advantage that an unhardened resin can be recovered and reused, and the feature that it provides a good working environment since the development is done with aqueous washout solution.

A liquid photosensitive resin composition used for forming a printing plate to print on a corrugated board generally comprises a prepolymer having an ethylenically unsaturated double bond, an ethylenically unsaturated compound and a photopolymerization initiator. A printing plate used for corrugated board printing is produced by imagewise exposing the liquid photosensitive resin composition to an actinic ray (photo-curing) and then conducting a developing process, a post-exposure process and a drying process.

One of the important physical properties required for a printing plate used for corrugated board printing is impact resilience. Japanese Patent Examined Publication No. 35481/1978 (An improved photosensitive composition for use in forming a flexographic printing plate) discloses that because a corrugated board has a rough and corrugated surface, a flexographic printing plate used for corrugated board printing having a low hardness (Shore A) of 35 to 45 degrees, an excellent strength and an excellent impact resilience is advantageous.

European Patent Unexamined Publication No. 263366 (A photoresin printing plate for use in printing a corrugated board) discloses the following. When corrugated board printing is conducted by using a photosensitive resin plate having a low hardness, paper dust or the like present on the surface of a corrugated board supplied to a printing machine often adheres to the surface of the printing plate. Because paper dust or the like, once adhered, can not be easily released from the surface of the printing plate, it is necessary to interrupt the operation of the printing machine in order to clean the printing plate. Therefore the photosensitive resin plate having a low hardness has a big practical problem that the productivity or the yield of the prints is inevitably lowered. In order to solve this problem, it is necessary to both reduce the surface tack of the printing plate and increase the impact resilience of the printing plate.

As mentioned above, a printing plate having a higher impact resilience is desirable in printing a corrugated board. As conditions of a liquid photosensitive resin composition to provide a printing plate having a higher impact resilience, the foregoing European Patent Unexamined Publication No. 263366 discloses that (1) (i) it is preferable to reduce the density of ester bonds, amide bonds and urethane bonds of the prepolymer contained in the liquid photosensitive resin composition because the presence of these bonds in the prepolymer has a tendency to reduce the impact resilience of the resultant photosensitive resin printing plate. Moreover (ii) when an unsaturated polyurethane is used as the prepolymer, a polyetherpolyol is advantageous as a polyol segment and (iii) particularly, the above unsaturated polyurethane prepolymer having 20% by weight or more of polytetramethylene glycol as the polyol segment provides a photosensitive resin printing plate having a higher impact resilience. Further, it teaches that (2) as the ethylenically unsaturated compound contained in the liquid photosensitive resin composition, an acrylate provides a photosensitive resin printing plate having a higher impact resilience than a methacrylate. However, a printing plate having superior impact resilience is still not obtained. The method (2) using the acrylate is not sufficient because the acrylate has a particular problem in toxicity and the obtained printing plate has low mechanical properties.

The present invention provides a liquid photosensitive resin composition used for forming a printing plate to print on a corrugated board. The low toxicity of the composition is not deteriorated. A printing plate for use in printing on a corrugated board obtained from the composition through a process for forming a plate is not deteriorated in necessary mechanical properties and the composition has an increased impact resilience.

DISCLOSURE OF THE INVENTION

The present inventors have found that in a liquid photosensitive resin composition used for forming a printing plate for printing on a corrugated board, which comprises an unsaturated polyurethane prepolymer having a polyether polyol as a polyol segment, a composition which comprises a specific amount of an acrylate monomer having a specific structure as an ethylenically unsaturated compound, can attain the above purpose.

That is, the present invention provides a liquid photosensitive resin composition used for forming a printing plate for printing on a corrugated board comprising:

(A) 100 parts by weight of an unsaturated polyurethane prepolymer having a polyether polyol as a polyol segment, (B) 17 to 200 parts by weight of an ethylenically unsaturated compound and (C) 0.01 to 10 parts by weight of a photopolymerization initiator, characterized by comprising 17 to 65 parts by weight of an acrylate monomer represented by the following formula (I) based on 100 parts by weight of the prepolymer of component (A) as the ethylenically unsaturated compound of component (B):

$$CH_2=CH-CO-O-(C_2H_4O)_n-R \qquad (I)$$

wherein n represents a number of 1 to 20, and R represents a linear or branched alkyl group having 2 to 22 carbon atoms.

The present invention will be described in detail below.

An unsaturated polyurethane prepolymer of the above component (A) is obtained by reacting a polyether polyol, a polyisocyanate having 2 or more isocyanate groups and a compound which comprises a functional group having an active hydrogen and an ethylenically unsaturated double bond in a molecule according to a known method.

The polyether polyols include polyoxyethylene glycol, polyoxypropylene glycol, polyoxytetramethylene glycol, polyoxyethylene-oxypropylene glycol random or block copolymer, polyoxyethylene-oxytetramethylene glycol random or block copolymer and polyoxypropylene-oxytetramethylene glycol random or block copolymer.

When the ratio of an oxyethylene group in the unsaturated polyurethane prepolymer is 5% by weight or more, aqueous development is easily conducted.

Polyisocyanates include tolylene diisocyanate, xylylene diisocyanate, hexamethylene diisocyanate, trimethylhexane diisocyanate and isophorone diisocyanate.

The functional groups having an active hydrogen and an ethylenically unsaturated double bond in a molecule include hydroxypropyl methacrylate, hydroxyethyl methacrylate and polypropylene glycol monomethacrylate.

With respect to the ratio of the hydroxyl group of the polyether polyol to the isocyanate group of the polyisocyanate, it is necessary that the amount of the latter is more than that of the former. The molecular weight of a polyurethane can be changed by changing this ratio. A polyurethane having a number average molecular weight of 5000 to 30000 is generally used.

Ethylenically unsaturated compounds of Component (B) include an ester of methacrylic acid, for example, an alkyl methacrylate such as lauryl methacrylate and stearyl methacrylate, a monomethacrylate of ethylene or polyethylene glycol or propylene or polypropylene glycol, a dimethacrylate of polyethylene glycol or polypropylene glycol, a trimethacrylate of trimethylol propane and caprolactone methacrylate. Because a compound having 2 or more ethylenically unsaturated double bonds increases the degree of hardness of the obtained hardened material, the compound must be used so that the desired hardness of the hardened material can be obtained. These ethylenically unsaturated compounds can be used alone or in combination according to the purpose. The amount of these compounds is 17 to 200 parts by weight based on 100 parts by weight of the prepolymer.

With respect to a photopolymerization initiator of Component (C), initiators usually used in the conventional photosensitive resin composition can be used. The photopolymerization initiators include ethers of benzoin such as benzoin isopropyl ether and benzoin isobutyl ether, and 2,2-dimethoxy-2-phenylacetophenone. These photopolymerization initiators can be used alone or in combination in view of storage stability of the photosensitive resin composition, the desired photo-hardening speed and the physical properties of the hardened material. The amount of the photopolymerization initiator is 0.01 to 10 parts by weight based on 100 parts by weight of the above prepolymer.

An acrylate monomer represented by formula (I) is an ester of a monoalkyl ether of polyethylene glycol having a repeating number of n and acrylic acid.

As an ethylenically unsaturated compound of Component (B), methacrylate monomers such as lauryl methacrylate, polypropylene glycol monomethacrylate and tetraethylene glycol monomethacrylate are mainly used because they have low toxicity and the obtained plate has excellent mechanical properties. However, not only does the above liquid photosensitive resin composition, which contains the acrylate monomer represented in an amount of formula (I) by 17 to 65 parts by weight based on 100 parts by weight of the prepolymer, maintain low toxicity, which is essential for a liquid photosensitive resin composition, but also the obtained printing plate maintains excellent mechanical properties and has a remarkably increased impact resilience. As a result, corrugated board printing can be conducted well. Paper dust or the like can be easily released from the surface of the printing plate. Further, performance such as low viscosity, storage stability, good reproducibility of negative to plate and good aqueous development, which the liquid photosensitive resin composition must have, are not deteriorated. Ink resistance, printing ink receptivity and transferability and durability performance of a printing plate obtained from the present resin composition are also not deteriorated.

Among various types of acrylate monomers such as benzyl acrylate, phenoxyethyl acrylate, nonylphenol ethylene oxide (or propylene oxide) modified acrylate, isobronyl acrylate, dicyclopentanyl acrylate, ethylene oxide (or propylene oxide) modified acrylic phthalate and ethylene oxide (or propylene oxide) modified acrylic succinate, a printing plate obtained by using the acrylate monomer represented by formula (I) has a high impact resilience.

The amount of the acrylate monomer represented by formula (I) is 17 to 65 parts by weight based on 100 parts by weight of the prepolymer. When the amount is less than 17 parts by weight, a remarkable improvement in impact resilience is not attained. When the amount is more than 65 parts by weight, reproducibility of image and mechanical strength of the plate are deteriorated. In order to attain conspicuous improvements in impact resilience, such as by more than ten percentage points and maintain good reproducibility of the hardened plate from a liquid resin and mechanical strength of the plate, the amount of the acrylate monomer represented by formula (I) is preferably 30 to 60 parts by weight. Further, when all of the monomers except for bifunctional monomers or multifunctional monomers, which are used to control the hardness of the hardened plate, are replaced with the acrylate monomer represented by formula (I), an improvement in impact resilience can be attained more effectively.

The symbol n in formula (I) represents a repeating number of oxyethylene group of 1 to 20. The larger n is, the higher the impact resilience is. However, when n becomes large, the effect of reducing the viscosity of the resin composition (dilution effect) imparted by the acrylate monomer represented by formula (I) becomes insufficient, and resistance to flexographic aqueous ink is reduced. In view of these points, n preferably does not exceed 20. Taking into consideration a balance between the impact resilience, dilution effect and ink resistance, n is more preferably 2 to 10.

R is a linear or branched alkyl group having 2 to 22 carbon atoms. The alkyl groups include an ethyl group, a propyl group, a butyl group, a pentyl group, an octyl group, an isooctyl group, a decyl group, an isodecyl group and 2-ethylhexyl group. When R is a methyl group, wherein the number of the carbon atoms is 1, the obtained printing plate unpreferably has low resistance to aqueous ink. When the number of the carbon atoms of the alkyl group exceeds 22, the dilution effect on the resin composition unpreferably decreases. In order to increase the dilution effect, R is preferably an alkyl group having 2 to 14 carbon atoms.

Concrete examples of the acrylate monomers represented by formula (I) include ethylene glycol ethylether acrylate, ethylene glycol butylether acrylate, diethylene glycol-2-ethylhexylether acrylate, nanoethylene glycol laurylether acrylate and triethylene glycol hexylether acrylate. They can be used alone or in combination.

If necessary, additives such as a light stabilizer, an antioxidant, a lubricant, a dye and a pigment may be added to the photosensitive resin composition according to the purpose.

In order to form a printing plate for use in printing on a corrugated board by using the liquid photosensitive resin composition of the present invention, the following process is generally conducted.

A negative film is put on a glass plate and covered with thin protective film. While the liquid photosensitive resin composition of the present invention is poured onto the protective film so that the resin composition can have a constant thickness, a base film of a support is laminated on the poured resin composition. A glass plate is put on the base film so that a layer of the liquid photosensitive resin composition can have a predetermined constant thickness. Next, exposure is conducted for a short time with an upper actinic ray source. Then back exposure is conducted to form a uniform thin resin layer, namely, an anchor layer on the entire area of the support of the plate. Relief is formed by conducting imagewise exposure with a lower actinic ray source. Unhardened resin is washed out and removed (development). The whole part of the obtained plate is immersed in water and then is further exposed to an actinic ray (post-exposure in water) to perform a complete hardening of the plate. A printing plate for use in printing a corrugated board is obtained by drying the plate having a complete hardening.

The impact resilience of the present invention is measured according to a falling ball method (20° C.). An iron ball having a diameter of 8 mm is allowed to fall by gravity from the height of 30 cm onto a sample plate having a thickness of 7 mm. Then, the height above the plate, S cm, reached by the ball which has rebounded from the plate is measured. The impact resilience (%) is determined by the following equation:

$$\text{impact resilience } (\%) = 100 \times (S/30)$$

In the measurement, the measured value of the impact resilience is changed if there is any surface tack of the sample plate. Therefore, after the surface of the sample plate is subjected to a powdering treatment with talc or the like, the measurement is conducted.

BEST MODE FOR CARRYING OUT THE INVENTION

Hereinafter, the present invention will be described in more detail with reference to examples and comparative examples.

(Comparative Example 1) (based on Example 1 of European Patent Unexamined Publication No. 263366)

A urethane polymer having isocyanate groups at both terminals was obtained by adding 2.4 mol of tolylene diisocyanate and 20 ppm of dibutyltin dilaurate to 1 mol of polypropylene glycol diol (number average molecular weight: 2000) and 1 mol of polytetramethylene glycol diol (number average molecular weight: 2000) and then reacting them at 80° C. for 2 hours. Next, an unsaturated polyurethane prepolymer was obtained by adding 2.0 mol polypropylene glycol monomethacrylate (molecular weight: 380) to the urethane polymer and then reacting them until the absorption peak ascribed to an isocyanate group (around 2260 cm-1) was hardly observed on an infrared absorption spectrum.

26 parts by weight of lauryl methacrylate, 17 parts by weight of tetraethylene glycol monomethylether monomethacrylate, 2.1 parts by weight of tetraethylene glycol dimethacrylate, 1.4 parts by weight of trimethylol propane trimethacrylate, 1.0 part by weight of 2,2-dimethoxy-2-phenylacetophenone and 0.7 part by weight 2,6-di-t-butyl-p-cresol were added to the 100 parts by weight of the prepolymer and then dissolved in the prepolymer by mixing them to obtain a liquid photosensitive resin composition.

The obtained liquid photosensitive resin composition had no problem in viscosity value and storage stability, compared with a conventional liquid photosensitive resin composition used for forming a printing plate to print a corrugated board (example: APR F-47 manufactured by Asahi Chemical Industry Co., Ltd.).

In order to obtain a printing plate having a thickness of 7 mm by using the liquid photosensitive resin composition, the following process was conducted. Imagewise exposure (masking exposure: 5 min. relief exposure: 4 min. back exposure: 40 sec.) was conducted with an exposure apparatus (ALF type manufactured by Asahi Chemical Industry Co., Ltd.). Next, an unhardened part was washed out by spraying a developer comprising 2% surfactant (W-8 manufactured by Asahi Chemical Industry Co., Ltd.) aqueous solution at 40° C. with a washing apparatus (AL-400W type manufactured by Asahi Chemical Industry Co., Ltd.). Next, the plate was immersed in water and then was exposed to UV light of a chemical lamp and UV light of a germicidal lamp at the same time for 10 min. by using a post-exposure apparatus (ALF-200UP type manufactured by Asahi Chemical Industry Co., Ltd.). Subsequently, the plate exposed to UV light was dried at 60° C. for 15 min.

The value of the impact resilience of the obtained plate was 35%. The liquid photosensitive resin composition had no problem in reproducibility of negative to plate and aqueous development and the obtained printing plate had no problem in mechanical strength, resistance to aqueous ink, printing ink receptivity and transferability, and durability, compared with the conventional liquid photosensitive resin composition used for forming a printing plate to print a corrugated board (example: APR F-47 manufactured by Asahi Chemical Industry Co., Ltd.) and the printing plate obtained from it.

(EXAMPLES 1 AND 2)

A liquid photosensitive resin composition and a printing plate having a thickness of 7 mm were obtained according to the same manner as in Comparative Example 1 except that the entire amount (17 parts by weight) of tetraethylene glycol monomethylether monomethacrylate was changed to 17 parts by weight of diethylene glycol-2-ethylhexylether acrylate. The impact resilience of the obtained plate was 43% (Example 1).

A liquid photosensitive resin composition and a printing plate having a thickness of 7 mm were obtained according to the same manner as in Comparative Example 1 except that the total amount (43 parts by weight) of tetraethylene glycol monomethylether monomethacrylate and lauryl methacrylate was changed to 43 parts by weight of diethylene glycol-2-ethylhexylether acrylate. The impact resilience of the obtained plate was 57% (Example 2).

The value of the viscosity and storage stability of the liquid photosensitive resin compositions obtained in Examples 1 and 2 were almost the same as those in Comparative Example 1. Reproducibility of negative to plate and aqueous development of the liquid photosensitive resin compositions, and mechanical strength, resistance to aqueous ink, printing ink receptivity and transferability, and durability of the printing plate obtained in Examples 1 and 2 were almost the same as those in Comparative Example 1. Therefore, the liquid photosensitive resin compositions have no problem in the above performance.

In order to confirm that paper dust or the like can be easily released from the surface of the printing plate obtained in Example 2, a printing test was conducted with a practical printing machine under the following condition.

Printing machine: 3FM-84 (three color printing machine) manufactured by Mitsubishi Heavy Industries, Ltd.

Ink: DF-140 of flexographic aqueous ink having ultramarine of color manufactured by Sakata Inx Corp.

Printing speed: 250 sheets/min.

Corrugated board: B flute (size: 125 cm×75 cm)

Number of corrugated board: 5000 sheets

During printing, when a corrugated board having a printing defect was found, the operation of the printing machine was interrupted in order to remove paper dust attached to the surface of the plate by cleaning it with a cloth. The evaluation on performance of releasability of paper dust or the like was conducted according to the number of interruption of the printing machine.

When the printing plate obtained in Example 2 was used, corrugated board printing was conducted well without interruption.

When the printing plate obtained in Comparative Example 1 was used, the number of interruptions of the printing machine was 10.

(EXAMPLES 3 TO 7)

A liquid photosensitive resin composition and a printing plate having a thickness of 7 mm were obtained according to the same manner as in Comparative Example 1 except that the total amount (43 parts by weight) of tetraethylene glycol monomethylether monomethacrylate and lauryl methacrylate was changed to 43 parts by weight of respective acrylate monomers represented by formula (I) shown in Table 1 in the respective Examples.

Values of impact resiliences of obtained plates are shown in Table 1.

TABLE 1

| Example | Acrylate monomer represented by formula (I) | n | Number of carbon atoms of R | Impact resilience (%) |
| --- | --- | --- | --- | --- |
| 2 | diethylene glycol-2-ethylhexylether acrylate | 2 | 8 | 57 |
| 3 | diethylene glycol ethylether acrylate | 2 | 2 | 57 |
| 4 | tetraethylene glycol-2-ethylhexyl ether acrylate | 4 | 8 | 60 |
| 5 | octaethylene glycol-2-ethylhexyl ether acrylate | 8 | 8 | 61 |
| 6 | nanoethylene glycol tridecylether acrylate | 9 | 13 | 59 |
| 7 | triethylene glycol hexylether acrylate | 3 | 6 | 62 |

The value of the viscosity and storage stability of liquid photosensitive resin compositions obtained in Examples 3 to 7 were almost the same as those in Example 2. Reproducibility of negative to plate and aqueous development of the liquid photosensitive resin compositions, and mechanical strength, resistance to aqueous ink, printing ink receptivity and transferability, and durability of the printing plate obtained in Examples 3 to 7 were almost the same as those in Example 2. Therefore, the liquid photosensitive resin compositions have no problem in the above performance.

(Comparative Example 2)

A urethane polymer having isocyanate groups at both terminals was obtained by adding 3.4 mol of tolylene diisocyanate and 20 ppm of dibutyltin dilaurate to 1 mol of polyoxyethylene-oxypropylene glycol block copolymer diol (number average molecular weight: 2500, ratio by weight of ethylene oxide to propylene oxide: 1/4) and 2.1 mol of polytetramethylene glycol diol (number average molecular weight: 1200) and then reacting them at 80° C. for 2 hours.

Next, an unsaturated polyurethane prepolymer was obtained by adding 4.9 mol polypropylene glycol monomethacrylate (molecular weight: 380) to the urethane polymer and then reacting them until the absorption peak ascribed to an isocyanate group (around 2260 cm-1) was hardly observed on an infrared absorption spectrum. The percentage by weight of an oxyethylene group in the unsaturated polyurethane prepolymer was about 9%.

26 parts by weight of lauryl methacrylate, 17 parts by weight of tetraethylene glycol monomethylether monomethacrylate, 2.1 parts by weight of tetraethylene glycol dimethacrylate, 1.4 parts by weight of trimethylol propane trimethacrylate, 1.0 part by weight of 2,2-dimethoxy-2-phenylacetophenone and 0.7 part by weight 2,6-di-t-butyl-p-cresol were added to the 100 parts by weight of the prepolymer and then dissolved in the prepolymer by mixing them to obtain a liquid photosensitive resin composition.

The obtained liquid photosensitive resin composition had no problem in viscosity value or storage stability, compared with a conventional liquid photosensitive resin composition used for forming a printing plate to print on a corrugated board (example: APR F-47 manufactured by Asahi Chemical Industry Co., Ltd.).

A printing plate having a thickness of 7 mm was obtained by using the liquid photosensitive resin composition according to the same manner as in Comparative Example. 1.

The value of the impact resilience of the obtained plate was 34%. The liquid photosensitive resin composition had no problem in reproducibility of negative to plate or aqueous development and the obtained printing plate had no problem in mechanical strength, resistance to aqueous ink, printing ink receptivity and transferability, or durability, compared with the conventional liquid photosensitive resin composition used for forming a printing plate to print a corrugated board (example: APR F-47 manufactured by Asahi Chemical Industry Co., Ltd.) and the printing plate obtained from it.

(EXAMPLES 8 AND 9)

A liquid photosensitive resin composition and a printing plate having a thickness of 7 mm were obtained according to the same manner as in Comparative Example 2 except that the entire amount (17 parts by weight) of tetraethylene glycol monomethylether monomethacrylate was changed to 17 parts by weight of diethylene glycol-2-ethylhexylether acrylate. The impact resilience of the obtained printing plate was 42% (Example 8).

A liquid photosensitive resin composition and a printing plate having a thickness of 7 mm were obtained according to the same manner as in Comparative Example 2 except that the total amount (43 parts by weight) of tetraethylene glycol monomethylether monomethacrylate and lauryl methacrylate was changed to 43 parts by weight of diethylene glycol-2-ethylhexylether acrylate. The impact resilience of the obtained printing plate was 52% (Example 9).

The value of the viscosity and storage stability of the liquid photosensitive resin compositions obtained in Examples 8 and 9 were almost the same as those in Comparative Example 2. Reproducibility of negative to plate and aqueous development of the liquid photosensitive resin compositions, and mechanical strength, resistance to aqueous ink, printing ink receptivity and transferability, and durability of the printing plate obtained in Examples 8 and 9 were almost the same as those in Comparative Example 2. Therefore, the liquid photosensitive resin compositions have no problem in the above performance.

Industrial applicability

The liquid photosensitive resin composition of the present invention comprises a specific amount of an acrylate monomer having a specific structure. When a printing plate for use in printing on a corrugated board is formed by using the liquid photosensitive resin composition, the obtained plate has an increased impact resilience. When corrugated board printing is conducted by using the plate, printing is conducted well and paper dust or the like can be easily released from the surface of the plate.

We claim:

1. A liquid photosensitive resin composition used for forming a printing plate to print on a corrugated board comprising:
   (A) 100 parts by weight of an unsaturated polyurethane prepolymer having a polyether polyol as a polyol segment and a number average molecular weight of 5000 to 30000,
   (B) 17 to 200 parts by weight of an ethylenically unsaturated compound and
   (C) 0.01 to 10 parts by weight of a photopolymerization initiator, wherein the ethylenically unsaturated compound of component (B) comprises 17 to 65 parts by weight of an acrylate monomer represented by the following formula (I) based on 100 parts by weight of the prepolymer of component (A):

$$CH_2=CH-CO-O-(C_2H_4O)_n-R \qquad (I)$$

wherein n represents a number of 1 to 20, and R represents a linear or branched alkyl group having 2 to 22 carbon atoms.

2. The liquid photosensitive resin composition according to claim 1, wherein the amount of acrylate monomer represented by formula (I) is 30 to 60 parts by weight.

3. The liquid photosensitive resin composition according to claim 1 or 2, wherein n in formula (I) represents a number of 2 to 10.

4. The liquid photosensitive resin composition according to claim 1 or 2, wherein R in formula (I) represents a linear or branched alkyl group having 2 to 14 carbon atoms.

5. The liquid photosensitive resin composition according to claim 1, wherein the amount of acrylate monomer represented by formula (I) is from 30 to 60 parts by weight based on 100 parts by weight of the prepolymer of component (A).

6. The liquid photosensitive resin composition according to claim 1, wherein the ethylenically unsaturated compound of component (B), other than the acrylate monomer of formula (I), is selected from the group consisting of an alkyl methacrylate, a monomethacrylate of ethylene glycol, polyethylene glycol, propylene glycol or polypropylene glycol, a dimethacrylate of ethylene glycol, polyethylene glycol, propylene glycol or polypropylene glycol, a trimethacrylate of trimethylol propane, a caprolactone methacrylate, and mixtures thereof.

7. The liquid photosensitive resin composition according to claim 6, wherein said component (B) comprises said acrylate monomer of formula (I) and tetraethylene glycol monomethacrylate.

8. The liquid photosensitive resin composition according to claim 1, wherein said acrylate monomer of formula (I) is selected from the group consisting of ethylene glycol ethylether acrylate, ethylene glycol butylether acrylate, diethylene glycol-2-ethylhexylether acrylate, nanoethylene glycol laurylether acrylate and triethylene glycol hexylether acrylate.

* * * * *